US005846094A

United States Patent [19]
Murray et al.

[11] Patent Number: 5,846,094
[45] Date of Patent: Dec. 8, 1998

[54] ELECTRICAL COUPLING METHOD AND APPARATUS FOR PRINTED CIRCUIT BOARDS INCLUDING A METHOD OF ASSEMBLY

[75] Inventors: Michael Patrick Murray, Chicago; Louis J. Lundell, Buffalo Grove, both of Ill.

[73] Assignee: Motorola, Inc., Schaumburg, Ill.

[21] Appl. No.: 608,650

[22] Filed: Feb. 29, 1996

[51] Int. Cl.[6] .................................................. H01R 4/58
[52] U.S. Cl. .............................. 439/91; 439/67; 439/493
[58] Field of Search .............................. 439/91, 67, 74, 439/60, 493

[56] References Cited

U.S. PATENT DOCUMENTS

| | | |
|---|---|---|
| 4,227,788 | 10/1980 | Shimizu et al. . |
| 4,689,721 | 8/1987 | Damerow et al. . |
| 4,815,979 | 3/1989 | Porter . |
| 4,950,171 | 8/1990 | Muzslay . |
| 4,993,958 | 2/1991 | Trobough et al. . |
| 5,059,129 | 10/1991 | Brodsky et al. . |
| 5,092,782 | 3/1992 | Beaman . |
| 5,123,851 | 6/1992 | Young et al. . |
| 5,270,508 | 12/1993 | Blood et al. . |
| 5,297,968 | 3/1994 | Johnson et al. ........................... 439/91 |
| 5,386,344 | 1/1995 | Beaman et al. . |
| 5,430,615 | 7/1995 | Keeth et al. . |

OTHER PUBLICATIONS

Shin Etsu Polymer America, Inc., ShinFlex Guide to Elastomer Connectors, May 1994, pp. 1–23.
Elastomeric Technologies, Inc., Elastomeric Connector Design Guide, 1993, pp. 1–12.

Primary Examiner—Gary F. Paumen
Assistant Examiner—T. C. Patel
Attorney, Agent, or Firm—John J. Oskorep

[57] ABSTRACT

Conductive pads (126) of a first PCB (114) and conductive pads (128) of a second PCB (116) are electrically coupled. An electrical device includes a housing portion (112) which has an inner face (122) including a protrusive element (200). First PCB (114) has a body (203) and a flexible portion (204) which includes conductive pads (126). An elastomeric connector (208), having an elastomeric face (210) and an elastomeric edge (212), is positioned adjacent to protrusive element (200). First PCB (114) is disposed within inner face (122) of housing portion (112) such that flexible portion (204) bends, preferably at an angle perpendicular to body (203) of first PCB (114), by protrusive element (200). Flexible portion (204) is secured to elastomeric face (210), thus securing conductive layers of elastomeric connector (208) to conductive pads (126). Conductive pads (128) of second PCB (116) are abutted to elastomeric edge (212), thereby electrical coupling conductive pads (126, 128) of first and second PCBs (114, 116).

17 Claims, 8 Drawing Sheets

FIG. 10B

ELECTRICAL COUPLING METHOD AND APPARATUS FOR PRINTED CIRCUIT BOARDS INCLUDING A METHOD OF ASSEMBLY

FIELD OF THE INVENTION

The present invention generally relates to electrically coupling printed circuit boards, and more specifically to electrically coupling printed circuit boards using elastomeric connectors.

BACKGROUND OF THE INVENTION

An electrical device is typically comprised of multiple printed circuit boards (PCBs) having electrical components soldered thereto. An electrical component is typically packaged in a plastic carrier having copper leads which can extend through and be soldered to plated through-holes of a PCB, providing an electrical coupling between the electrical component and the PCB. Routing space for electrical conductors within the PCB is limited because the electrical conductors must go around the copper leads which extend through the PCB. To increase routing space, methods have been devised to mount electrical components onto surfaces of the PCBs without using copper leads and plated through-holes. One common method has been to provide conductive pads on the surface of the PCB and then to wave solder conductive leads of the electrical components to the conductive pads. With this method, there are no leads extending through the PCB, and so it is possible to mount the electrical components on both sides of the PCB. This greatly increases the number of electrical components which may be placed on the PCB.

When electrically coupled, PCBs may communicate with each other within an electrical device. Electrical coupling is typically provided using a pair of mating connectors which have wave-solderable conductive leads. A mating connector is usually soldered to the PCB after the electrical components of the PCB have been soldered. Unfortunately, when this soldering occurs, a large portion of the PCB must be raised to a melting point of the solder being used. When electrical components are on both sides of a PCB, the electrical components facing downward may fall off due to melting solder and gravity. In addition, every time the PCB is subjected to wave soldering, the PCB is degraded, especially the conductive pads. Assembling the electrical device may be difficult due to the physical interconnection required between the mating connectors. Repairing the mating connector also poses difficulty since the PCB must be reflowed, requiring the PCB to be sent through a wave solder machine. A wave solder machine is typically large, expensive, and found only in manufacturing facilities.

Conventional methods using elastomeric connectors have been somewhat helpful in solving some of the above-mentioned problems. Made of alternating layers of conductive and non-conductive silicone rubber, an elastomeric connector can provide an electrical coupling between PCBs when it is "sandwiched" between conductive pads of the PCBs. These methods have provided PCBs with solderless connections at a relatively low cost.

However, the conventional methods using elastomeric connectors have been limited. For example, conventional methods are not useful when conductive pads of the PCBs do not face each other within an electrical device. This problem occurs often when the electrical device is designed using an inexpensive single-sided flex circuit. In addition, PCBs may be positioned within an electrical device at a large distance, where an elastomeric connector has to span the large distance. Here, since minimum compressive forces are needed at each end of the elastomeric connector to maintain a secure electrical coupling, a tall elastomeric connector becomes difficult if not hopeless to use since it buckles due to the compressive forces. Of course, the large distance between the PCBs would also require the elastomeric connector to be fairly long and therefore expensive. Furthermore, a tall elastomeric connector has greater tolerances associated with it and, for example, may undesirably expand and contract greatly over temperature variations. This may possibly cause unreliable electrical coupling between two PCBs.

Accordingly, there is a need for a method of electrically coupling PCBs within an electrical device which utilizes inexpensive materials, maintains a secure electrical coupling, and provides an easy assembly.

DETAILED DESCRIPTION OF THE PREFERRED EMBODIMENTS

According to the present invention, conductive pads of a first PCB and conductive pads of a second PCB are electrically coupled. An electrical device includes a housing portion which has an inner face including a protrusive element. The first PCB has a body and a flexible portion which includes the conductive pads. An elastomeric connector, having an elastomeric face and an elastomeric edge, is positioned adjacent to the protrusive element. The first PCB is disposed within the inner face of the housing portion such that the flexible portion bends, preferably perpendicular to the body of the first PCB, by the protrusive element. The flexible portion is secured to the elastomeric face, thus securing the conductive pads to conductive layers of the elastomeric connector. The conductive pads of the second PCB are abutted to the elastomeric edge, thereby electrically coupling the conductive pads of the second PCB to at least a portion of the same conductive layers coupled to the conductive pads of the first PCB. Thus, the conductive pads of the first and second PCBs are electrically coupled.

Figure 1:
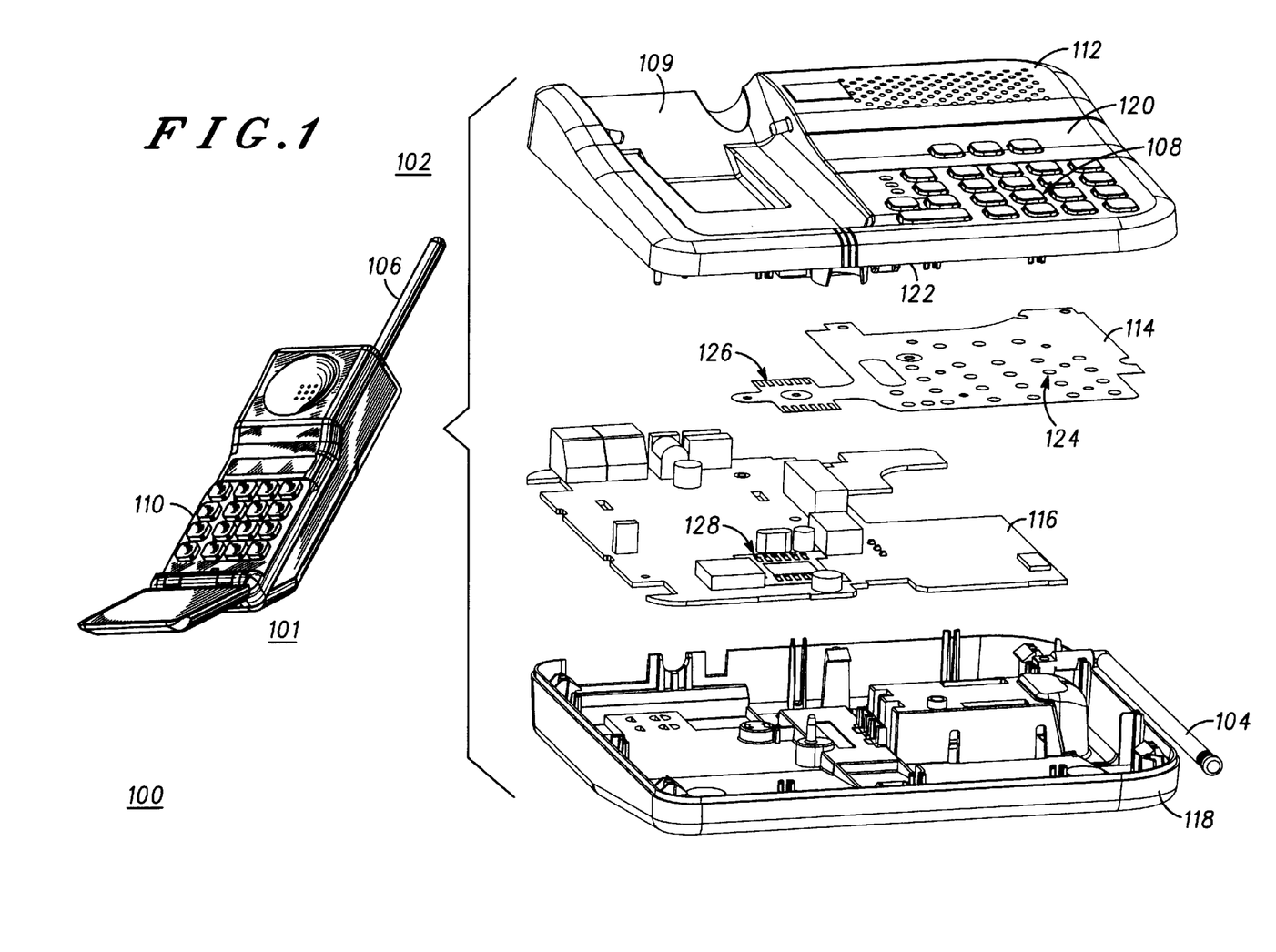
FIG. 1 is a drawing of a communication system the drawing showing an exploded view of a base station which may embody the present invention.

FIG. 1 is a drawing of a communication system 100 which may embody the present invention. Communication system 100 comprises two electrical devices, a mobile station 101 and a base station 102 (shown in exploded view). Mobile station 101 comprises a mobile station antenna 106 and a mobile station keypad 110. Base station 102 comprises a housing portion 112, a printed circuit board (PCB) 114, a PCB 116, and a housing portion 118. Housing portion 112 has an outer face 120, displaying a cradle 109 and a base station keypad 108, and an inner face 122. Mobile station 101 typically rests within cradle 109 of base station 102. PCB 114 has one side which includes conductive pads 124 and conductive pads 126, and is disposed within inner face 122 of housing portion 112. Conductive pads 124 and conductive pads 126 both face in the direction of inner face 122 and are electrically coupled via electrical conductors (not visible) within PCB 114. PCB 116 includes conductive pads 128 which also face in the direction of inner face 122. Preferably, conductive pads 128 are carbon conductive pads. PCB 114 and PCB 116 are positioned substantially parallel to one another within base station 102.

Base station 102 connects to a telephone land line network to provide telephone communications. Mobile station 101 and base station 102 communicate via radio frequency (RF) signals through mobile station antenna 106 and base station antenna 104. By depressing keys of base station keypad 108 and mobile station keypad 110, various functions, including dual-tone multiple frequency (DTMF) signaling, are provided in communication system 100.

Each key of base station keypad 108 has a bottom which includes a conductive carbon pad (not visible). When one of the keys of base station keypad 108 is depressed, its corresponding conductive carbon pad depresses on at least two of the conductive pads 124, thereby electrically coupling the at least two of the conductive pads 124. An electrical circuit is thereby completed, creating an electrical signal detectable at conductive pads 126 through the electrical conductors within PCB 114. Since conductive pads 126 are coupled with conductive pads 128 in accordance with the present invention, the electrical signal is also detectable at conductive pads 128. The electrical signal is processed further by other electrical means disposed on PCB 116.

Figure 2:
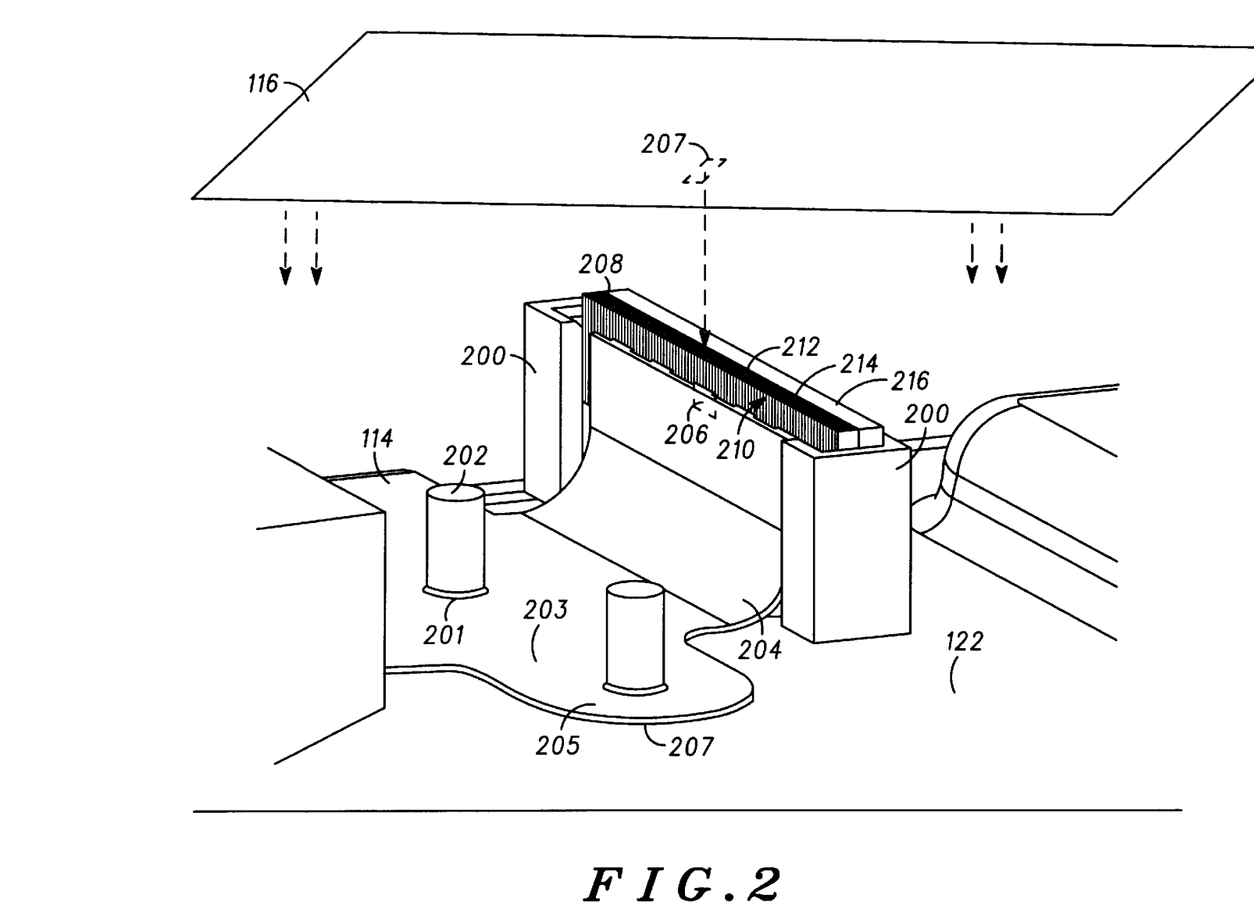
FIG. 2 is a drawing of a coupling apparatus in accordance with the present invention.

FIG. 2 is a drawing which illustrates a coupling apparatus in accordance with the present invention. FIG. 2 shows a portion of inner face 122 of housing portion 112, a portion of PCB 114, and PCB 116. Inner face 122 has a protrusive element 200 and a pin 202. Preferably, protrusive element 200 is molded out of housing portion 112, but it need not be. PCB 114 has a first side 205 and a second side 207, and also includes a body 203 and a flexible portion 204. Body 203 of PCB 114 is positioned substantially parallel with PCB 116, and preferably includes a hole 201. A conductive pad 206, one of several conductive pads 126 shown in FIG. 1, is located on second side 207 of flexible portion 204. PCB 116 includes a conductive pad 207 (located on the opposite side of PCB 116 shown), which is one of several conductive pads 128 (see FIG. 1) of PCB 116. An elastomeric connector 208 is provided and comprised of an elastomeric portion 214 having alternating conductive and non-conductive layers. Elastomeric connector 208, consisting of a plurality of conductive and non-conductive layers, and having an elastomeric face 210 and an elastomeric edge 212, rests adjacent to protrusive element 200 such that at least a portion of elastomeric face 210 is exposed and elastomeric edge 212 faces parallel to PCB 116. Elastomeric face 210 and elastomeric edge 212 are contact areas of elastomeric connector 508. Elastomeric connector 208 is preferably of the type manufactured by Elastomeric Technologies Incorporated of Hatboro, Pa., U.S.A.

When PCB 114 is inserted within inner face 122 of housing portion 112, flexible portion 204 bends by protrusive element 200. In the preferred embodiment, flexible portion 204 bends at an angle which is substantially perpendicular to body 203 of PCB 114. Pin 202 assists in securing PCB 114 within inner face 122 by protruding through hole 201 of PCB 114. Protrusive element 200 and elastomeric connector 208 are positioned such that elastomeric face 210 makes contact with conductive pad 206 of flexible portion 204 when PCB 114 is inserted. Once flexible portion 204 is secured to elastomeric face 210 using a fastener, conductive pad 206 is securely coupled to some of the conductive layers of elastomeric connector 208. PCB 116 is then abutted with elastomeric edge 212 such that an electrical coupling is established between conductive pad 207 and some of the same conductive layers of elastomeric connector 208 coupled to conductive pad 206. Therefore, conductive pad 206 of PCB 114 is electrically coupled to conductive pad 207 of PCB 116. Other conductive pads of PCBs 114 and 116 may be electrically coupled together in the same manner. An opposing pressure against PCB 116 from another housing portion, such as housing portion 118 of FIG. 1, may be necessary to ensure electrical coupling of conductive pad 207 to elastomeric edge 212.

In this embodiment, elastomeric connector 208 also includes a padded foam gasket portion 216. Padded foam gasket portion 216 is a compressive material which assists in maintaining a constant compressive force between flexible portion 204 and elastomeric face 210 over temperature and other variables. Padded foam gasket portion 216 preferably is PORON™ manufactured by Rogers Corporation of East Woodstock, Conn., U.S.A.

Figure 3:
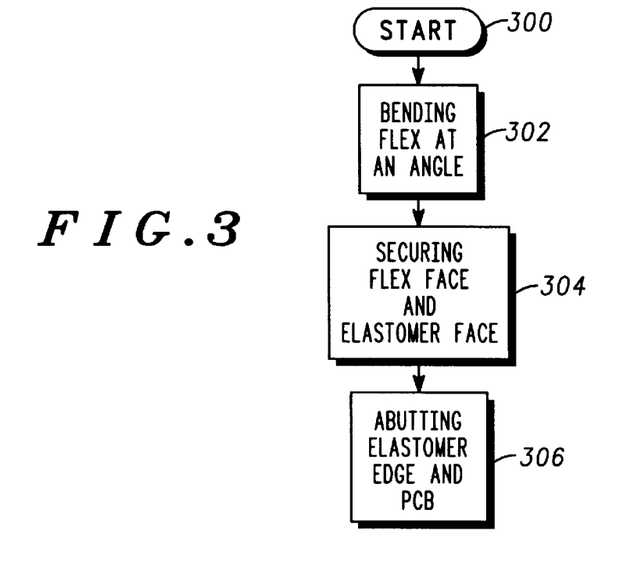
FIG. 3 is a flowchart of a method according to the present invention.

As simplified in the flowchart of FIG. 3, a method of electrically coupling a first PCB and a second PCB in accordance with the present invention is described. Starting at a step 300, flexible portion 204 of PCB 114 bends, preferably at a 90° angle, by protrusive element 200 at step 302. Flexible portion 204 is secured to elastomeric face 210 of elastomeric connector at step 304. In step 304, conductive pad 206 of flexible portion 204 is electrically coupled to conductive layers of elastomeric connector 208. At step 306, PCB 116 and elastomeric edge 212 are adjoined such that conductive pad 207 of PCB 116 is electrically coupled to at least some of the same conductive layers coupled to conductive pad 206. Thus, conductive pad 206 of PCB 114 and conductive pad 207 of PCB 116 are electrically coupled.

Figures 4A, 4B:
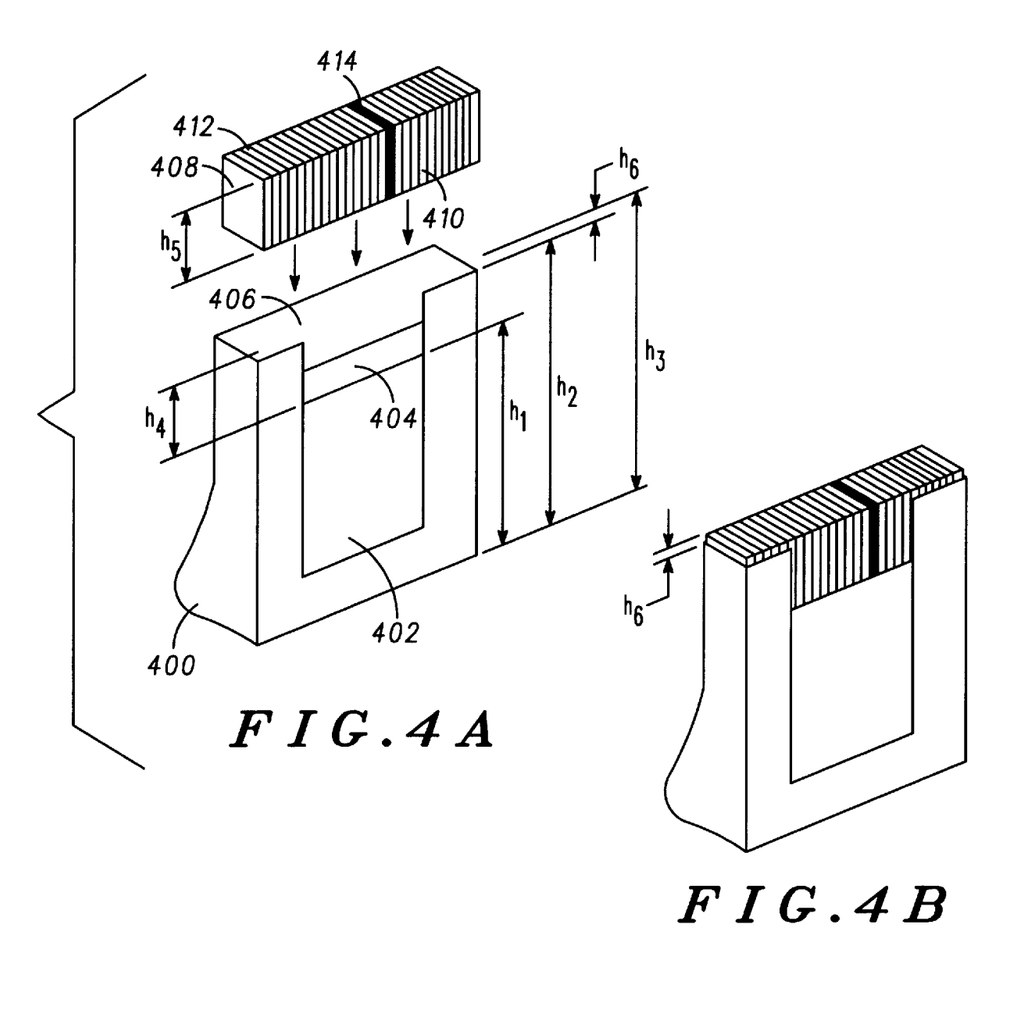
FIG. 4A is a drawing of a preferred embodiments of a protrusive element and an elastomeric connector in accordance with the present invention, showing the elastomeric connector located outside the protrusive element.
FIG. 4B is a drawing of the preferred embodiment of FIG. 4A, showing the elastomeric connector located within the protrusive element.

FIG. 4A is a drawing of the preferred embodiments of a protrusive element 400 and an elastomeric connector 408. Elastomeric connector 408 has a height $h_5$, and includes an elastomeric face 410, an elastomeric edge 412, and a conductive layer 414. Protrusive element 400 has a seat-like molding 402, including a seat top 404 and a seat back 406. Seat back 406 may be referred to as a protrusive element face. Protrusive element 400 has a height $h_2$ and seat top 404 lies at a height $h_1$. Without seat-like molding 402, elastomeric connector 408 would have to be at a height $h_3$ to connect to a PCB. However, if elastomeric connector 408 is rested upon seat top 404, it needs only to be at a height $h_4$ equivalent to height $h_3$ minus height $h_1$. Thus, elastomeric connector 408 may be designed to be at height $h_5$ equivalent to height $h_4$. An extra height $h_6$ is needed to allow for compressive forces from a PCB (for example, PCB 116 in FIG. 2) when it rests upon elastomeric edge 412. FIG. 4B, showing extra height $h_6$ in more detail, is a drawing showing elastomeric connector 408 positioned on seat top 404 of protrusive element 400. Using the preferred embodiments as described, a flexible portion, such as flexible portion 204 (FIG. 2), to be secured with elastomeric face 410, must have a length such that a conductive pad of the flexible portion reaches a height somewhere between height $h_1$ and height $h_2$. Protrusive element 400 and elastomeric connector 408 are preferred because the size of elastomeric connector 408 is substantially reduced. Thus, using the preferred embodiments, spanning a large distance between first and second PCBs is possible without using a relatively large and expensive elastomeric connector. Since protrusive element 400 may be manufactured using a relatively inexpensive material, and further may be molded out of an inner face of a housing portion, this arrangement reduces cost. The market for a consumer product, such as communication system 100 of FIG. 1, is typically very cost sensitive.

Figure 5:
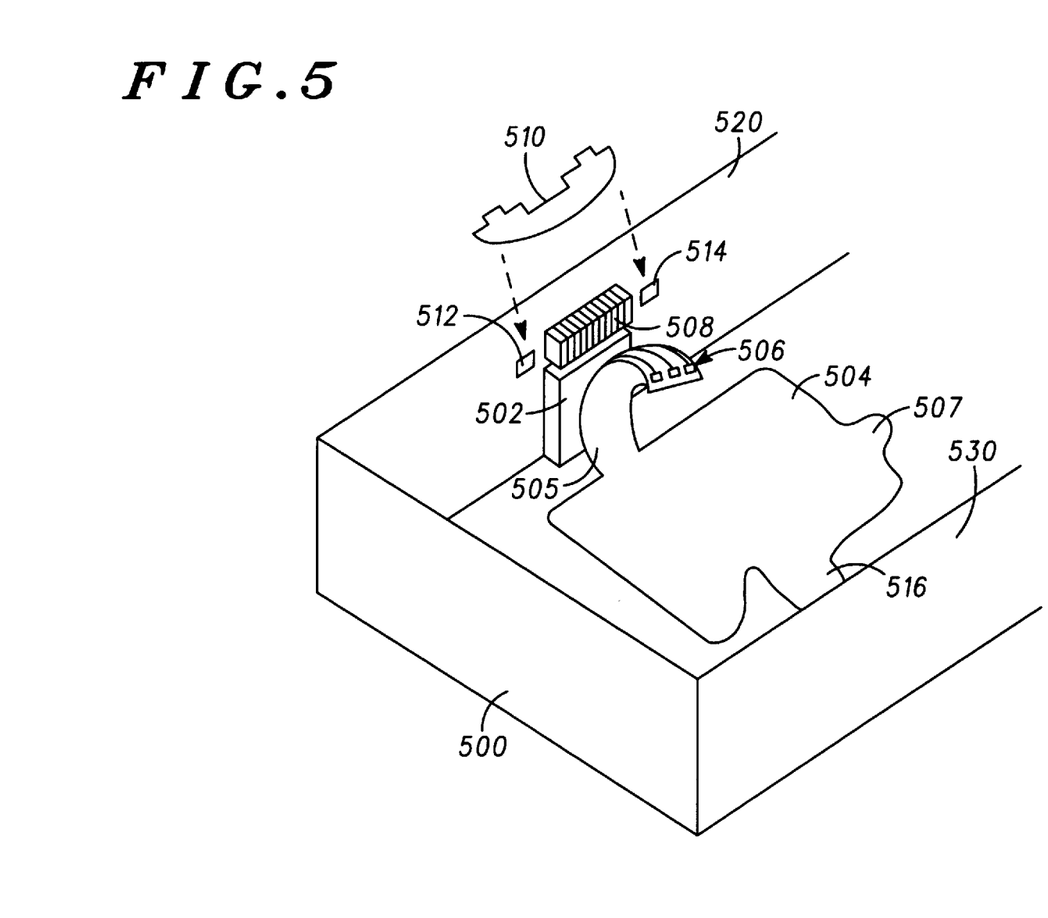
FIG. 5 is an alternate embodiment of a coupling apparatus in accordance with the present invention.

FIG. 5 illustrates an alternate embodiment of a coupling apparatus in accordance with the present invention. A housing portion 500 includes a side wall 520 having a protrusive element 502 and holes 512 and 514. Protrusive element 502 has a seat-like molding which is molded out of side wall 520. A flex circuit 504 has a body 507 and a flexible portion 505 including a conductive pad 506. A clip 510 and an elastomeric connector 508 are also provided in the coupling apparatus. When flex circuit 504 is inserted into housing portion 500, flexible portion 505 bends, by means of protrusive element 502, such that conductive pad 506 meets with elastomeric connector 508. Flexible portion 505 is secured to elastomeric connector 508 using clip 510, which has first and second ends which insert into holes 512 and 514. Clip 510 secures and maintains an electrical coupling between conductive pad 506 and conductive layers of elastomeric connector 508. Upon further assembly, when a PCB having a conductive pad is abutted to a top edge of elastomeric connector 508, the conductive pad of the PCB is electrically coupled to conductive pad 506 via conductive layers of elastomeric connector 508. In addition, flex circuit 504 may include a flexible portion 516 and housing portion 500 may include a side wall 530, where flexible portion 516 extends to side wall 530 to another coupling apparatus designed in accordance with the present invention. This addition may be preferred since a PCB can be positioned within housing portion 500 such that it rests stably upon two coupling apparatuses, and also because connections can be easily provided at various locations on a PCB.

Figure 6:
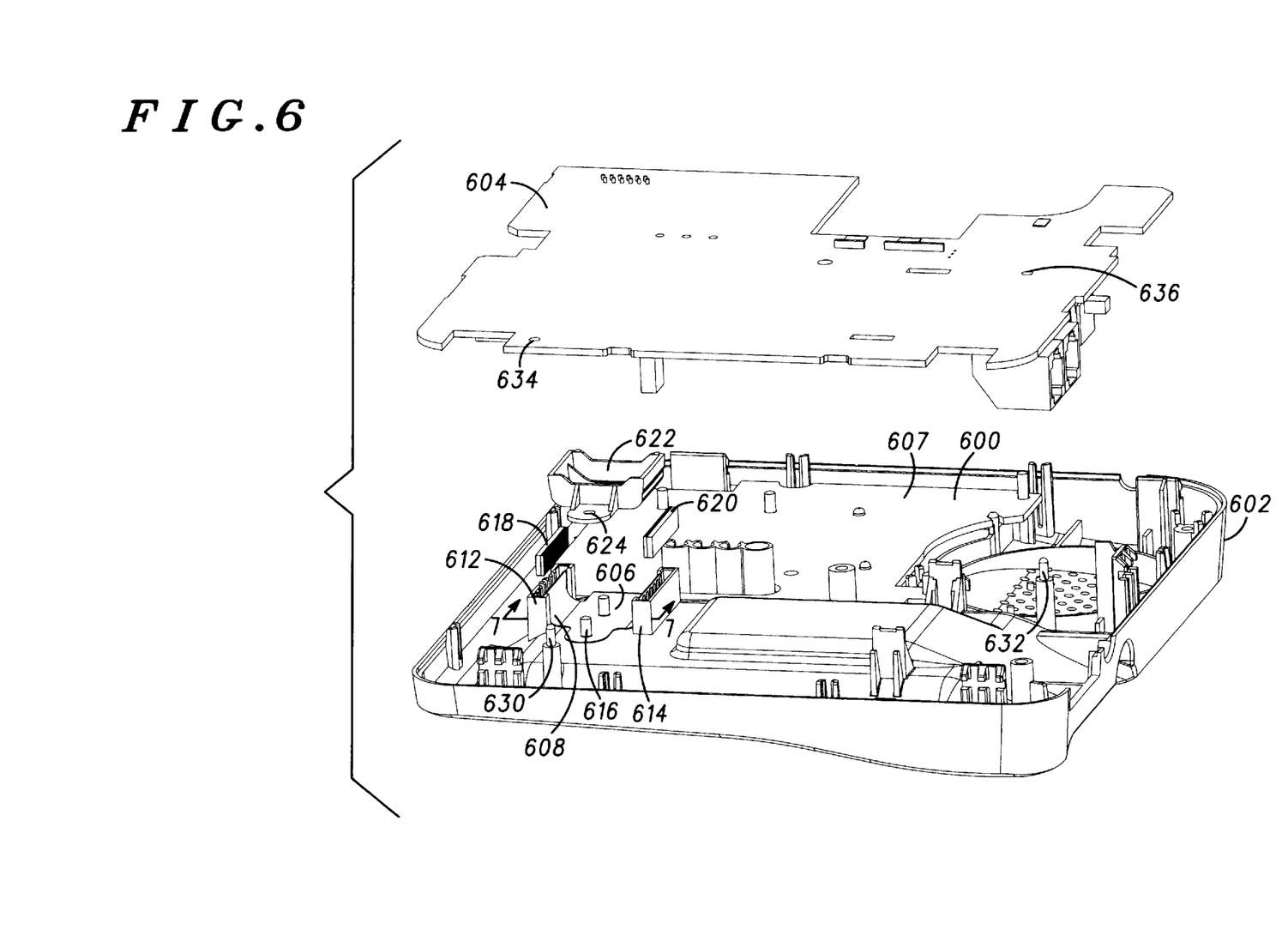
FIG. 6 is a drawing of an exploded view of an electrical device including the preferred embodiment of a coupling apparatus in accordance with the present invention.
Figure 8:
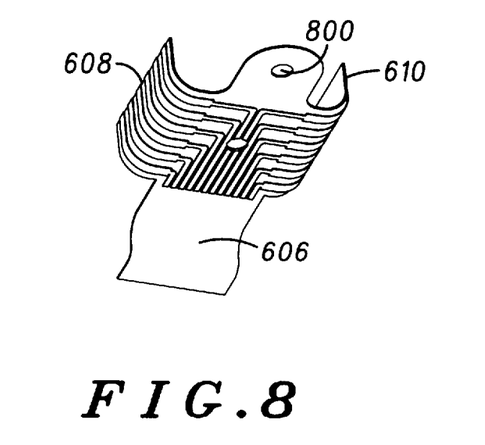
FIG. 8 is a close-up isometric of a flexible portion of a PCB of the coupling apparatus shown in FIG. 6 and FIG. 7.

FIG. 6 is a drawing of an exploded view of a portion of an electrical device. FIG. 6 shows a PCB 600, a PCB 604, a housing portion 602, a retainer 622, an elastomeric connector 618, and an elastomeric connector 620. Housing portion 602 includes a protrusive element 612, a protrusive element 614, a pin 616, and pins 630 and 632. Retainer 622 includes a hole 624. PCB 604 includes a hole 634 and a hole 636. PCB 600 is a flex circuit having a body 607 and a flexible portion 606, the flexible portion 606 including a flex end 608 and a flex end 610 (not visible in FIG. 6). A close-up drawing of flexible portion 606 is shown in FIG. 8, which additionally shows a hole 800 of flexible portion 606. Preferably, flex circuit is of the type manufactured by Tadco Incorporated of Rockport, Mass., U.S.A.

Referring back to FIG. 6, elastomeric connectors 618 and 620 are inserted within protrusive elements 612 and 614 respectively. When PCB 600 is disposed within housing portion 602, flex ends 608 and 610 of flexible portion 606 bend by protrusive elements 612 and 614 respectively. Pin 616 is inserted through hole 800 of flexible portion 606 to position and secure PCB 600 properly within housing portion 602. Retainer 622 is inserted between protrusive elements 612 and 614 to secure and provide compression between flex end 608 and elastomeric connector 618, and between flex end 610 and elastomeric connector 620. Pin 616 of housing portion 602 extends through hole 624 of retainer 622. Preferably, hole 624 and pin 616 are each sized to provide a secure mechanical coupling between retainer 622 and housing portion 602. Conductive pads (not visible in FIG. 6) of PCB 604 make contact with edges of elastomeric connectors 618 and 620 when PCB 604 is rested on top of housing portion 602. Pins 630 and 632 insert within holes 634 and 636 for placement guidance of PCB 604 into housing portion 602. Pins 630 and 632 and holes 634 and 636 may be sized to provide a secure mechanical coupling between PCB 604 and housing portion 602, providing PCB 604 with a potential "snap" fit within housing portion 602.

Figure 7:
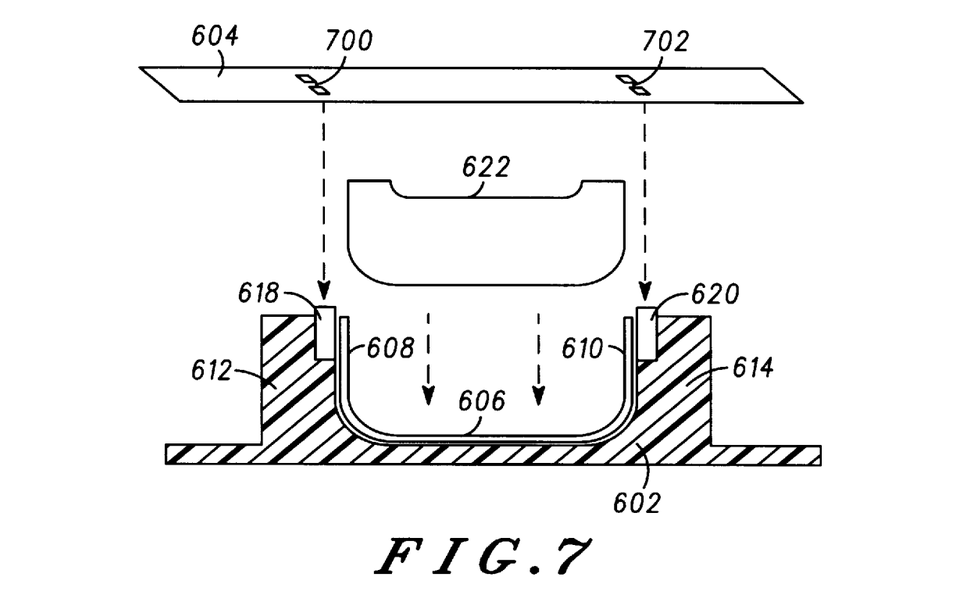
FIG. 7 is a cross-section view of the coupling apparatus taken along line 7–7' in FIG. 6.

FIG. 7 shows a cross-sectional view of the drawing of FIG. 6 taken along line 7–7'. FIG. 7 additionally shows conductive pads 700 and 702 of PCB 604. Upon assembly, PCB 604 is inserted towards housing portion 602 such that conductive pads 700 abut a top edge of elastomeric connector 618, and conductive pads 702 abut a top edge of elastomeric connector 620.

A coupling apparatus designed in accordance with the present invention provides many advantages. First, the coupling apparatus has a simple construction and is inexpensive. For example, a coupling apparatus may be made using an inexpensive single-sided flex circuit, molding from a housing portion (a housing portion which is already needed to encompass a PCB), a small and inexpensive elastomeric connector, and a simple fastener. Second, a coupling apparatus according to the present invention provides resting support for a PCB at a desired height. Third, the present invention can accommodate large gaps between first and second PCBs while minimizing the size of an elastomeric connector. Fourth, and as will be discussed further below, assembling such a coupling apparatus is easy and requires little time.

The preferred embodiment of the present invention as shown in FIGS. 6, 7, and 8 provides even further advantages. First, conductive pads 700 and 702 on PCB 604 may be positioned throughout PCB 604 to create a less complicated PCB design. For example, depressed keys of base station keypad 108 (FIG. 1) may need to be processed by a processor on PCB 116. Since a packaging of the processor likely has a rectangular shape and input pins which are dispersed along several edges of its body, top edges of elastomeric connectors 618 and 620 can be positioned around the processor to help provide for more direct connections to the input pins. Second, the use of two of more protrusive elements provides a more stable support for which a PCB may rest upon.

Figure 9:
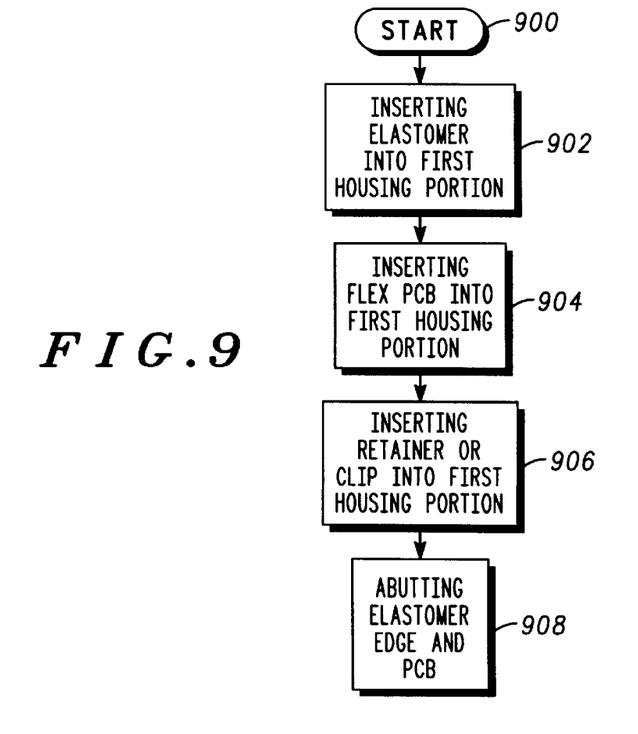
FIG. 9 is a flowchart of a method of assembly according to the present invention.

As stated above, a coupling apparatus designed according to the present invention substantially reduces the difficulty and the time required to assemble an electrical device. FIG. 9 shows a flowchart of an assembly method according to the present invention. In this assembly example, stepping through the flowchart of FIG. 9 will coincide with the preferred embodiment of FIGS. 6, 7, and 8. Starting at step 900, elastomeric connectors 618 and 620 are inserted into housing portion 602 at step 902. At step 904, PCB 600 is inserted into housing portion 602. In this step, flex ends 608 and 610 bend, preferably perpendicular to body 607, by protrusive elements 612 and 614. At step 906, retainer 622 is inserted into housing portion 602 between protrusive elements 612 and 614. In this step, an electrical coupling between conductive pads of flex ends 608 and 610 and conductive layers of elastomeric connectors 618 and 620 is secured. Finally, at step 908, PCB 604 is abutted to top elastomeric edges of elastomeric connectors 618 and 620. Electrical coupling between conductive pads of PCB 600 and conductive pads of PCB 604 is thereby achieved.

Assembly is easy since elastomeric connectors 618 and 620, PCB 600, retainer 622, and PCB 604 may be placed into housing portion 602 in a single direction. For example, all parts may be placed in a simple downward direction along a z-axis, thus reducing assembly difficulty and time. Automated assembly methods for an electrical device utilizing such a coupling apparatus are now more realizable. In the preferred embodiment of assembly, steps 902, 904, and 906 of FIG. 9 are done separately in a process which minimizes cost of assembly (such as that which may be done by a third-party vendor). Therefore, the only assembly required for a final assembly is abutting the PCB with the elastomeric connector. Note that the method of assembly according to the present invention is not limited to the preferred embodiment. For example, the coupling apparatus of FIG. 5 may be assembled in a similar way, where a substantial number of parts may be placed in the same direction.

While particular embodiments of the present invention have been shown and described, modifications may be made. For example, where FIG. 6 shows two protrusive elements 612 and 614 for bending two flex ends 608 and 610 respectively, three or more protrusive elements and flex ends may be used to achieve the same or a greater number of connections. More specifically, for example, a third protrusive element may be positioned in FIG. 6 such that it is perpendicular to both protrusive elements 612 and 614, forming a U-shape with them. Similarly, a single protrusive element may have a U-shape which provides three protrusive element faces for three bending flex ends.

Figure 10A:
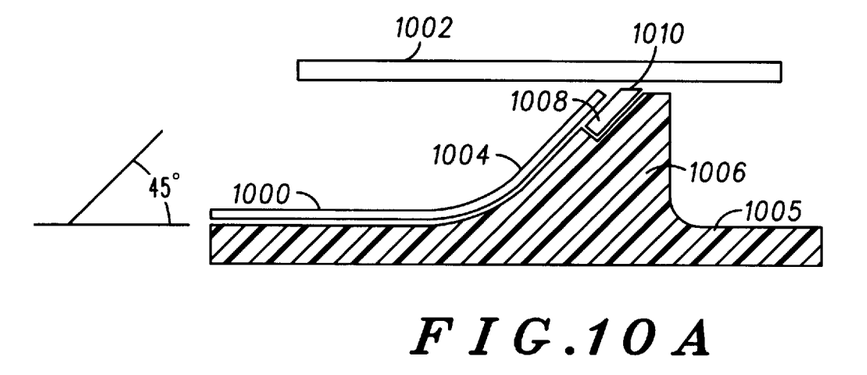
FIG. 10A is a cross-section view of an alternate embodiment of the present invention.
Figure 10B:
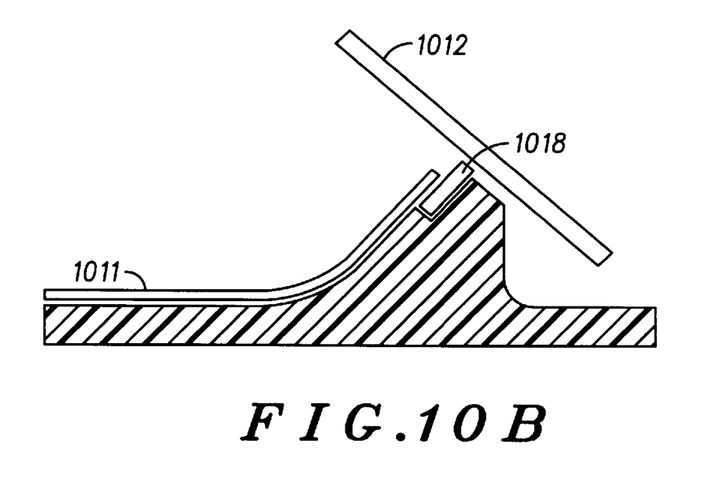
FIG. 10B is a cross-section view of another alternate embodiment of the present invention.

Additional alternate embodiments are illustrated in FIGS. 10A and 10B. FIG. 10A is a cross-sectional side view showing a housing portion 1005 having a protrusive element 1006, a flex circuit 1000 having a flexible portion 1004, a PCB 1002, and an elastomeric connector 1008 having an angled top edge 1010. This embodiment shows that flex circuit 1000 and PCB 1002 may be electrically coupled where flexible portion 1004 bends at an angle of about 45°. Thus, it is conceivable that other angles may be utilized in accordance with the present invention. FIG. 10B shows a similar embodiment, where the coupling apparatus comprises a flex circuit 1011, a PCB 1012, and an elastomeric connector 1018. Here, PCB 1012 and flex circuit 1011 are not parallel. Thus, FIG. 10B shows that, according to the present invention, a PCB need not be parallel to another PCB.

It is therefore intended in the appended claims to cover all such changes and modifications which fall within the true spirit and scope of the invention.

What is claimed is:

1. An electrical device, comprising:
   a housing portion, said housing portion defining an inner face having a substantially planar surface and including a protrusive element;
   a first printed circuit board (PCB), said first PCB having a body and a flexible portion, said body having conductive pads disposed thereon and said flexible portion having at least a first conductive pad, said first PCB disposed in said housing portion such that said body is parallel and adjacent to said inner face and said flexible portion bends at an angle by said protrusive element; and
   an elastomeric connector, said elastomeric connector having a plurality of conductive strips and a first contact area, said elastomeric connector disposed adjacent to said flexible portion such that said first contact area makes contact with said at least a first conductive pad.

2. The electrical device according to claim 1, wherein said elastomeric connector further includes a second contact area, said electrical device further comprising:
   a second PCB, said second PCB including at least a second conductive pad, said second PCB positioned substantially parallel to said body of said first PCB and abutting said elastomeric connector such that said second contact area makes contact with said at least a second conductive pad, thereby electrically coupling said at least first and second conductive pads.

3. The electrical device according to claim 1, wherein said first PCB is a flex circuit.

4. The electrical device according to claim 1, wherein said protrusive element assists in maintaining said flexible portion at an angle within a range of about 45° and 90°.

5. The electrical device according to claim 1, wherein said protrusive element assists in maintaining said flexible portion at an angle of 90°.

6. The electrical device according to claim 1, wherein said protrusive element has a seat-like molding whereon said elastomeric connector rests.

7. The electrical device according to claim 1, wherein said protrusive element includes a side wall of said housing portion.

8. The electrical device according to claim 1, wherein said first PCB is a flex circuit, said protrusive element assists in maintaining said flexible portion at an angle of about 90°, and said protrusive element includes a seat-like molding whereon said elastomeric connector rests.

9. An electrical device, comprising:
   a housing portion having an inner face and an outer face, said inner face including first and second protrusive elements having first and second protrusive element faces, respectively;
   a flex circuit disposed in said housing portion adjacent to said inner face, said flex circuit including a flex body and a flexible portion, said flexible portion including a first flex end and a second flex end, said first flex end having a first flex face including at least a first flex conductive pad, said second flex end having a second flex face including at least a second flex conductive pad, said first and second flex ends bent at angles substantially perpendicular to said flex body along said first and second protrusive element faces, respectively;
   a first elastomeric connector having a first elastomeric face and a first elastomeric edge, said first elastomeric connector disposed between said first protrusive element face and said first flex face;
   a second elastomeric connector having a second elastomeric face and a second elastomeric edge, said second elastomeric connector disposed between said second protrusive element face and said second flex face;
   a retainer disposed between said first and said second protrusive element faces to maintain pressure between said first elastomeric face and said first flex face and between said second elastomeric face and said second flex face; and a printed circuit board (PCB) having at least third and fourth PCB conductive pads, said PCB positioned substantially parallel to said flex body, substantially perpendicular to said first and second elastomeric edges, and in abutment with said first and said second elastomeric edges such that said at least third and fourth PCB conductive pads are electrically coupled to said first and second flex conductive pads, respectively.

10. The electrical device according to claim 9, wherein said first and said second protrusive elements have first and second seat-like moldings, respectively, said first and second seat-like moldings providing resting positions above said inner face for said first and second elastomeric connectors, respectively.

11. A communication device, comprising:

a housing portion, said housing portion having an inner face and an outer face, said inner face including a protrusive element;

a keypad, said keypad having a plurality of keys, said keypad disposed in said housing portion such that said plurality of keys are displayed on said outer face;

a single-sided flex circuit, said single-sided flex circuit disposed in said housing portion, said single-sided flex circuit used for accepting inputs from said keypad and including a flex body and a flexible portion, said flex body disposed substantially parallel to said inner face, said flexible portion including at least a first conductive pad and bending at an angle along said protrusive element;

a printed circuit board (PCB), said PCB positioned substantially parallel to said flex body and including at least a second conductive pad; and an elastomeric connector, said elastomeric connector having a plurality of conductive layers, a first contact area, and a second contact area, said first contact area secured to said flexible portion to maintain an electrical coupling between said plurality of conductive layers and said at least a first conductive pad, said PCB in abutment with said second contact area to maintain an electrical coupling between said at least a second conductive pad and at least a portion of said plurality of conductive layers for electrically coupling said at least first and second conductive pads.

12. The communication device according to claim 11, wherein said protrusive element includes a side wall of said housing portion.

13. A method of assembling an electrical device, the electrical device including a housing portion, a first printed circuit board (PCB), and an elastomeric connector, the housing portion including a protrusive element, the first PCB including a body and a flexible portion having a flex face including at least a first conductive pad, the elastomeric connector having a plurality of conductive layers, a first contact area, and a second contact area, the method comprising the steps of:

inserting the elastomeric connector in the housing portion and adjacent to the protrusive element such that the second contact area of the elastomeric connector faces outward from the housing portion; and inserting the first PCB in the housing portion such that the flexible portion bends, upon insertion and by means of the protrusive element, at an angle such that the at least a first conductive pad of the flex face and the first contact area of the elastomeric connector substantially face each other.

14. The method according to claim 13, further comprising the step of:

inserting a fastener in the housing portion for maintaining a pressure between the at least a first conductive pad and the first contact area of the elastomeric connector, thereby securing an electrical coupling between the at least a first conductive pad and the plurality of conductive layers.

15. The method according to claim 14, further comprising the step of:

abutting a second PCB to the second contact area of the elastomeric connector, the second PCB having at least a second conductive pad and positioned such that the at least a second conductive pad makes contact with the second contact area to provide an electrical coupling between the at least a second conductive pad and at least a portion of the plurality of conductive layers, thereby electrically coupling the at least a first and second conductive pads.

16. The method according to claim 13, further comprising the step of:

inserting a retainer between the protrusive element and a second protrusive element of the housing portion, the retainer maintaining a pressure between the at least a first conductive pad and the first contact area of the elastomeric connector, thereby securing an electrical coupling between the at least a first conductive pad and the plurality of conductive layers.

17. The method according to claim 16, further comprising the step of:

abutting a second PCB to the second contact area of the elastomeric connector, the second PCB having at least a second conductive pad and positioned such that the at least a second conductive pad makes contact with the second contact area to provide an electrical coupling between the at least a second conductive pad and at least a portion of the plurality of conductive pads, thereby electrically coupling the at least a first and second conductive pads.

* * * * *